(12) United States Patent
Humphrey et al.

(10) Patent No.: US 6,777,966 B1
(45) Date of Patent: Aug. 17, 2004

(54) CLEANING SYSTEM, DEVICE AND METHOD

(75) Inventors: Alan E. Humphrey, Livermore, CA (US); Billie Jean Freeze, Livermore, CA (US)

(73) Assignee: International Test Solutions, Inc., Livermore, CA (US)

( * ) Notice: Subject to any disclaimer, the term of this patent is extended or adjusted under 35 U.S.C. 154(b) by 208 days.

(21) Appl. No.: 09/624,750

(22) Filed: Jul. 24, 2000

Related U.S. Application Data (60) Provisional application No. 60/146,526, filed on Jul. 30, 1999.

(51) Int. Cl.$^7$ ............................ G01R 31/02; B08B 7/00; B08B 3/14; A47L 11/00; A47L 11/32
(52) U.S. Cl. ............................ 324/757; 134/6; 134/42; 15/4; 15/97.1
(58) Field of Search .................................. 324/754, 757, 324/758, 761, 765; 134/6, 22.1, 22.11, 18, 42; 15/4, 21.1, 97.1, 104.002, 104.93

(56) References Cited

U.S. PATENT DOCUMENTS

| | | | | |
|---|---|---|---|---|
| 2,800,215 A | | 7/1957 | Converse | 197/185 |
| 3,148,404 A | | 9/1964 | Jensen | 15/605 |
| 4,590,422 A | * | 5/1986 | Milligan | 324/754 |
| 5,220,279 A | | 6/1993 | Nagasawa | 324/158.1 |
| 5,813,081 A | | 9/1998 | Wang et al. | 15/210.1 |
| 5,968,282 A | * | 10/1999 | Yamasaka | 324/754 |
| 5,998,986 A | * | 12/1999 | Ido | 324/754 |
| 6,037,793 A | * | 3/2000 | Miyazawa et al. | 324/760 |
| 6,057,694 A | * | 5/2000 | Matsudo | 324/765 |
| 6,118,289 A | * | 9/2000 | Kitani et al. | 324/754 |
| 6,118,290 A | * | 9/2000 | Sugiyama et al. | 324/754 |
| 6,127,831 A | * | 10/2000 | Khoury et al. | 324/754 |
| 6,130,104 A | * | 10/2000 | Yamasaka | 324/754 |

FOREIGN PATENT DOCUMENTS

| | | | | |
|---|---|---|---|---|
| JP | 01120828 A | * | 5/1989 | 134/18 |

* cited by examiner

*Primary Examiner*—Kamand Cuneo
*Assistant Examiner*—Jermele Hollington
(74) *Attorney, Agent, or Firm*—Gray Cary Ware & Freidenrich LLP (57) ABSTRACT

The cleaning device may clean probe elements. The probe elements may be the probe elements of a probe card testing apparatus for testing semiconductor wafers or semiconductor dies on a semiconductor wafer or the probe elements of a handling/testing apparatus for testing the leads of a packaged integrated circuit. During the cleaning of the probe elements, the probe card or the handler/tester is cleaned during the normal operation of the testing machine without removing the probe card from the prober. The cleaning device may be placed within the prober or tester/handler similar to a wafer containing semiconductor dies to be tested so that the probe elements of the testing machine contact the cleaning medium periodically to remove debris and/or reshape the tips of the probe elements. The cleaning device may include a substrate, that may be shaped and sized like a typical semiconductor wafer that typically fits into the testing machine, and a pad attached to the upper surface of the substrate that cleans and/or reshapes the probe element tips without removing the testing head with the probe elements from the testing machine. The cleaning medium may chemically clean the probe elements and trap the environmentally hazardous material within and on the pad.

28 Claims, 5 Drawing Sheets

CLEANING SYSTEM, DEVICE AND METHOD

RELATED CASES

This application claims priority from U.S. Provisional Patent Application No. 60/146,526 filed Jul. 30, 1999 and the provisional application is incorporated herein.

BACKGROUND OF THE INVENTION

This invention relates generally to a medium for cleaning a manual test interface while it is still in the prober. This manual interface is generally referred to as a probe card, which is used in the prober to make an electrical connection between the die on a silicon wafer and the tester so that the functionality of the die may be evaluated.

Currently, the method for cleaning the probe card is to remove it from the prober and manually clean the debris from the probe tips. The probe tips need to be cleaned to remove debris from them since the debris reduces the quality of the electrical circuit completed by the contact of the probe tips to any surfaces on a die. The completed electrical circuit is used to evaluate the electrical characteristics of the die by the test apparatus. The degradation of the quality of the electrical circuit caused by the probe tip debris may be interpreted by the test apparatus as a failure of the die under test even though the die is functioning correctly. This false failure of the die results in the rejection or the rework of good die thereby increasing the cost of the final products sold. In the industry, it has been seen that a 1% change in yield from an individual prober can equate to more than $1,000,000 per annum. Therefore, with thousands of probers operating worldwide, the impact to the industry from maintaining clean probes during testing can be very substantial.

Individual semiconductor (integrated circuit) devices are typically produced by creating multiple devices on a silicon wafer using well known semiconductor processing techniques including photolithography, deposition, and sputtering. Generally, these processes are intended to create multiple, fully functional integrated circuit devices prior to separating (singulating) the individual devices (dies) from the semiconductor wafer. However, in practice, physical defects in the wafer material and defects in the manufacturing processes invariably cause some of the individual devices to be non-functional, some of which may be repairable. It is desirable to identify the defective devices prior to separating or cutting the dies on the wafer. In particular, some product is actually repairable when the flaws are caught at the wafer lever. Other product may not be repairable but may be used in a downgraded application from the original product. This determination of the product's capabilities ( a product definition provided by electrical probe testing) at the wafer level saves the manufacturer considerable cost later in the manufacturing process. In addition, product cost may be reduced if defective devices are identified.

To enable the manufacturer to achieve this testing capability a probe card, prober and tester are employed to make temporary electrical connections to the bonding pads, solder or gold bumps or any surface on the chip where connection can be made by making manual contact to that surface. The surface may be on the individual circuit device or on multiple circuit devices when the devices are still part of a wafer. Once the connections between the tester and the circuit device are made, power and electrical signals are transferred from the tester to the device for testing, to determine its functionality and to identify its acceptance or rejection for further processing. Typically, the temporary connections to the device bonding elements are made by contacting multiple electrically conductive probes (needle like structures) against the electrically conductive bonding elements of the device. By exerting controlled pressure (downwards force on the bonding pads) of the probe tips against the bonding pads, a satisfactory electrical connection is achieved allowing the power, ground and test signals to be transmitted.

The tester and prober need a manual interface to the bonding elements on the die to achieve contact. A probe card having a plurality of probes is used to make the connection with the bonding pads of the semiconductor die. The probes may be cantilever beams or needles or vertical beams. Typically, each probe is an inherently resilient spring device acting as a cantilever beam, or as an axially loaded column. A variation is to mount multiple probes in a spring-loaded support. In a conventional prober, the probe card, and its multiple probes, are held in precise mechanical alignment with the bonding elements of the device under test (or multiple devices, or wafer as the case may be) and the device is vertically translated into contact with the tips of the probes. In the typical prober, the tips of the probes may perform a scrubbing action in which the tip of the probes moves horizontally as it contacts the bonding pad in order to scrub away oxide, or any other material on the pad, that may inhibit the electrical contact between the probes and the bonding pads. Although the scrubbing action improves the electrical contact between the probe tip and the bonding pad, it unfortunately also generates some debris (the scraped up oxide or other debris) that may also prevent the probe tip from making a good electrical contact with the bonding pad. Alternatively, the probe tip may press vertically into the bonding pad, solder or gold bump with sufficient force to penetrate any surface material and establish good electrical contact. The probe tip may become contaminated with contaminates such as aluminum, copper, lead, tin or gold.

Typically, the debris generated by probing needs to be periodically removed from the probe elements to prevent a build-up which causes increased contact resistance, continuity failures and false test indications, which in turn results in artificially lower yields and subsequent increased product costs. Typically, the entire probe card with the plurality of probes must be removed from the prober and cleaned or abrasively cleaned in the prober. In a typical prober, the probe card is cleaned as often as several times an hour.

The process of cleaning in the prober using an abrasive pad burnishes the tips but it does not remove the debris. The burnishing actually causes wear to the probe card by shortening the probe tips. In addition, since it does not remove the debris, and since the debris exhibits a slight electrical charge, it attracts more debris so the probe card will require cleaning more often than the original clean card. Currently the debris from burnishing can be removed manually by means of alcohol and a cotton tip swab or an air gun. Each method cleans the probes but requires stopping the prober and a person to perform the function.

Other contaminates, such as lead and tin, may be removed by abrasive cleaning/burnishing or cleaning the probes with a solution that may typically be an acid for example. When probe cards which have collected lead and tin are burnished, particulates of lead are released into the air that cause environmental hazards. In addition, the acid solution requires a separate, rather expensive machine that sprays the solution onto the tips in a closed chamber. These typical cleaning processes are expensive since the tester will have down time and a replacement card must be purchased to run while the other probe card is being cleaned. In addition the equipment and manual labor adds additional costs to the task performed.

It is desirable to provide a probe card cleaning device and method which overcomes the above limitations and drawbacks of the conventional cleaning devices and methods so that the probe cards may be cleaned more rapidly and effectively while in the prober and it is to this end that the present invention is directed. The cleaning device and method may also be used with other devices.

SUMMARY OF THE INVENTION

In accordance with the invention, a cleaning medium is provided that will clean the probes of a probe card without removing the probe card from the prober. In particular, the cleaning medium may be placed within the prober similar to a wafer being tested so that the probes of the probe card contact the cleaning medium periodically to remove debris and/or contaminates from the probes. In a preferred embodiment, the cleaning medium may include a substrate that may be shaped like a typical semiconductor wafer that typically fits into the prober. The substrate may also be a ceramic plate or any type of substrate, which can fit over or replace the abrasive plate in the prober. The pad may have predetermined mechanical and/or chemical characteristics, such as abrasiveness, density, elasticity, tackiness, planarity, and/or chemical properties, such as being acetic or basic, so that when the probe tips contact the pad surface, the tips of the probes are cleaned and the debris and contaminates are removed from the tips. In another embodiment, the pad may be made of a material so that the probe tips may penetrate into or through the pad, which cleans the debris from the tips. In a preferred embodiment, the substrate may be a semiconductor wafer, ceramic, or any material to which the cleaning pad will attach. In another embodiment, the physical properties of the pad, such as density and abrasiveness, may be predetermined so as to clean the probe element and remove bonded or embedded debris from the probe elements without causing significant damage to the probe elements. In another embodiment, the physical properties of the pad, such as density and abrasiveness, may be predetermined so as to shape or reshape the probe elements during probing on or into the medium.

Thus, in accordance with the invention, a cleaning medium for cleaning probe elements in a semiconductor testing apparatus is provided wherein the cleaning medium comprises a substrate having a configuration to be introduced into the testing apparatus during normal testing operation, and a pad, secured to the substrate. The pad has predetermined characteristics, which clean debris from the probe elements and maintain or modify the shape of the probe element when the elements contact or penetrate into or through the pad.

In accordance with another aspect of the invention, a method for cleaning the probe elements on a prober or an analyzer is provided wherein the method comprises loading a cleaning medium into the prober, the cleaning medium having the same configuration as the wafers with the semiconductor dies normally tested by the testing apparatus and the cleaning medium having a top surface with predetermined properties, such as abrasiveness, tack, hardness, that clean the probes. The method further comprises contacting the probe elements with the cleaning medium during the normal testing operation in the prober so that any debris is removed from the probe elements during the normal operation of the prober or analyzer.

In accordance with another aspect of the invention, a method for maintaining or modifying the shape of the probe elements on a prober or an analyzer is provided wherein the method comprises loading a cleaning medium into the prober or analyzer, the medium having varying density, tack, abrasiveness or other physical characteristics which are optimized for various probe elements of the probe cards.

DETAILED DESCRIPTION OF A PREFERRED EMBODIMENT

The invention is particularly applicable to a cleaning medium for cleaning the probes in a prober and it is in this context that the invention will be described. It will be appreciated, however, that the device and method in accordance with the invention has greater utility, such as cleaning other types of semiconductor processing equipment. The cleaning method can also be used on an analyzer which is a metrology tool used in the routine maintenance of probe cards.

Figure 1:
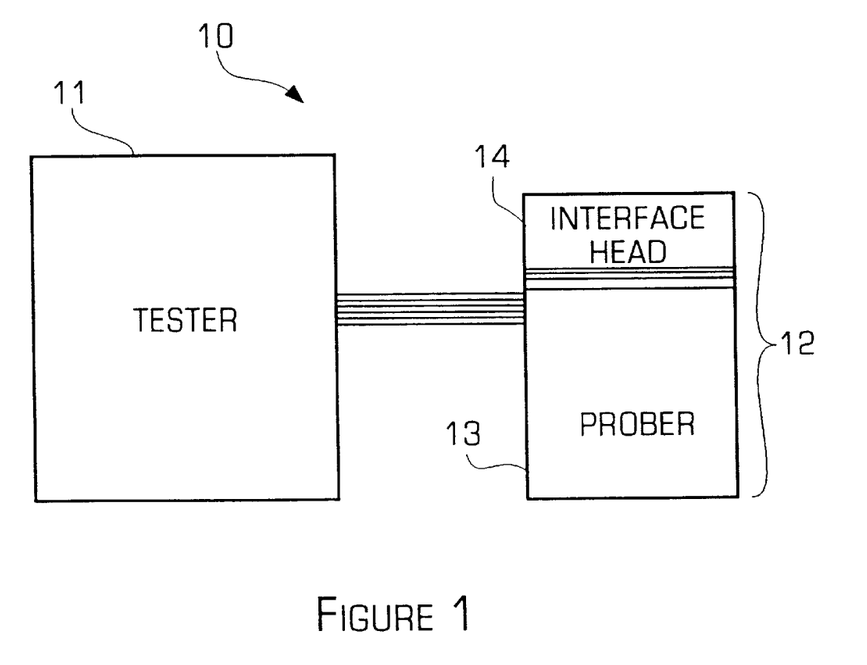
FIG. 1 is a side view of an automated testing system that may include the cleaning device in accordance with the invention.
Figure 2:
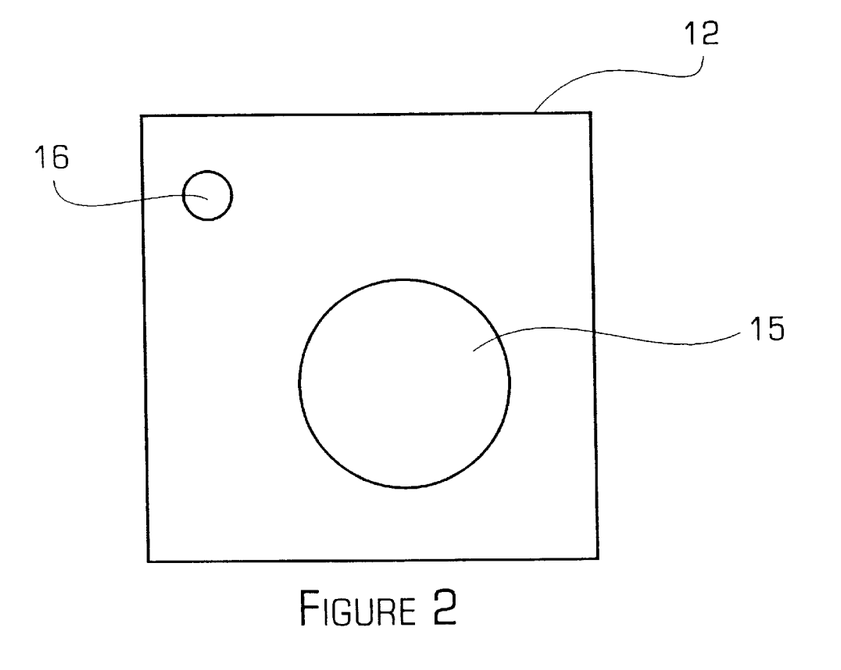
FIG. 2 is a top view of the automated testing system of FIG. 1.

FIGS. 1 and 2 are diagrams illustrating a testing system 10 that may be cleaned using the cleaning medium in accordance with the invention. In particular, the system 10 may include a tester 11 electrically connected to a prober machine 12 that may actually apply the probes to the semiconductor wafer or die and test them. The prober machine 12 may further include a prober 13 and an interface head 14 as shown in FIG. 1. The prober machine 12 may also have an abrasion/sanding disk 16, which is typically used to burnish the probe tips, as shown in FIG. 2. The prober machine 12 may also include a prober chuck 15 that moves the wafers/dies during the testing process. Instead of the typically removing the prober 13 in order to clean the probe elements, the cleaning device in accordance with the invention permits the probe elements to be cleaned while the prober is operating. In particular, a cleaning wafer cassette containing the cleaning device in accordance with the invention may be introduced periodically into the testing system in accordance with the invention. Alternatively, a cleaning device in accordance with the invention may be loaded into each cassette with other wafers being tested so that the probe elements are cleaned each time a cassette of wafers is tested. Thus the cleaning medium will clean the probe needles during the normal testing operation of the prober. Now the cleaning medium in accordance with the invention will be described in more detail.

Figure 3:
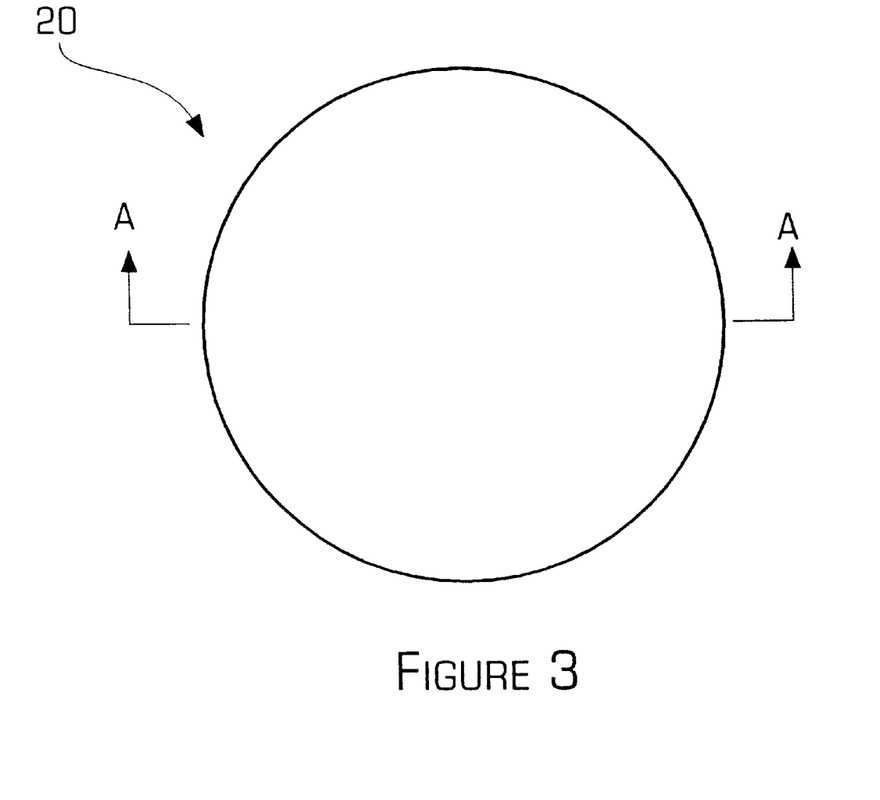
FIG. 3 is a top view of a cleaning device in accordance with the invention.
Figure 4:
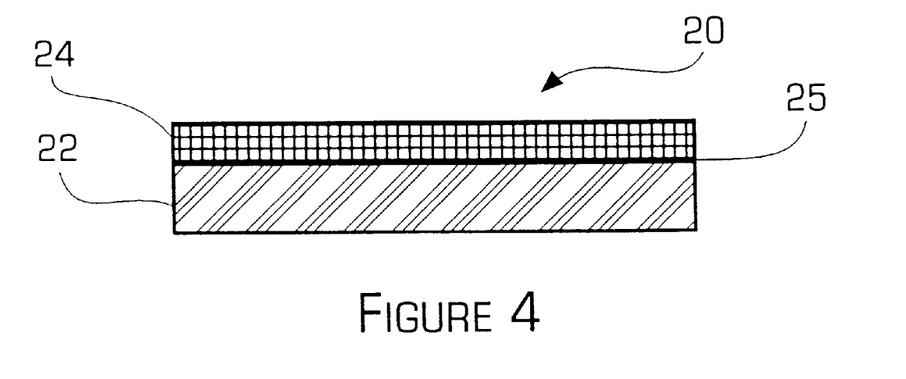
FIG. 4 is a sectional view taken along line A—A in FIG. 3 of the cleaning device in accordance with the invention.

FIGS. 3 and 4 are diagrams illustrating a cleaning device 20 in accordance with the invention. As shown in FIG. 4, the cleaning device 20 may include a substrate 22 and a pad 24 secured or adhered to a surface 25 of the substrate. The substrate may be any material that can support the pad and has sufficient strength to resist breaking when the probes come into contact with the pad and generate a contact force. Thus, the substrate may be plastic, metal, glass, silicon, ceramic or any other similar material. In a preferred embodiment, the substrate 22 may be a semiconductor wafer. The wafer surface 25 onto which the pad is secured or adhered may have a flat mirror finish or a slightly abrasive roughness finish with microroughness of about 1–3μm. The abrasive finish may burnish/abrade the probe tips during the cleaning process.

The pad 24 may be made of a material with predetermined properties that contribute to the cleaning of the probe elements tips that contact the pad. For example, the pad may have abrasive, density, elasticity, and/or tacky properties that contribute to cleaning the probe tips. The abrasiveness of the pad will loosen debris from the scrubbing action and remove unwanted material from the tips. Using a more dense material, the abrasiveness of the pad may round or sharpen the probe tips. Typical abrasives that may be used include aluminum oxide, silicon carbide, and diamond although the abrasive material may also be other well known abrasive materials. The tackiness of the pad may cause any debris on the probe tip to preferentially stick to the pad and therefore be removed from the probe tip. In a preferred embodiment, the pad may be made of an elastomeric material that may include rubbers and both synthetic and natural polymers. The elastomeric material may be a material manufactured with a slight tackiness or some abrasive added to the body of the material. The material may have a predetermined elasticity, density and surface tension parameters that allow the probe tips to penetrate the elastomeric material and remove the debris on the probe tips without damage to the probe tip, while retaining the integrity of the elastomeric matrix. In the preferred embodiment, the elastomeric material may be Gel-Pak LLC "GEL" membrane with a thickness of the elastomeric material being generally between 1 and 20 mils thick. The thickness of the pad may be varied according the specific configuration of the probe tip.

As the one or more probe elements of the prober contact the pad during the normal operation of the prober machine, they exert a vertical contact force to drive the probe element into the pad where the debris on the probe elements will be removed and retained by the pad material. The amount and size of the abrasive material added to the elastomer may vary according the configuration and material of the probe elements to achieve a pad, which will remove the debris but will not damage the probe elements. The pad material and abrasiveness may vary in the manufacturing of a pad used to reshape or sharpen the probe element tips. The same cleaning and reshaping may also be accomplished by the substrate alone. Now, a method for cleaning a plurality of probe elements in accordance with the invention will be described.

Figure 5:
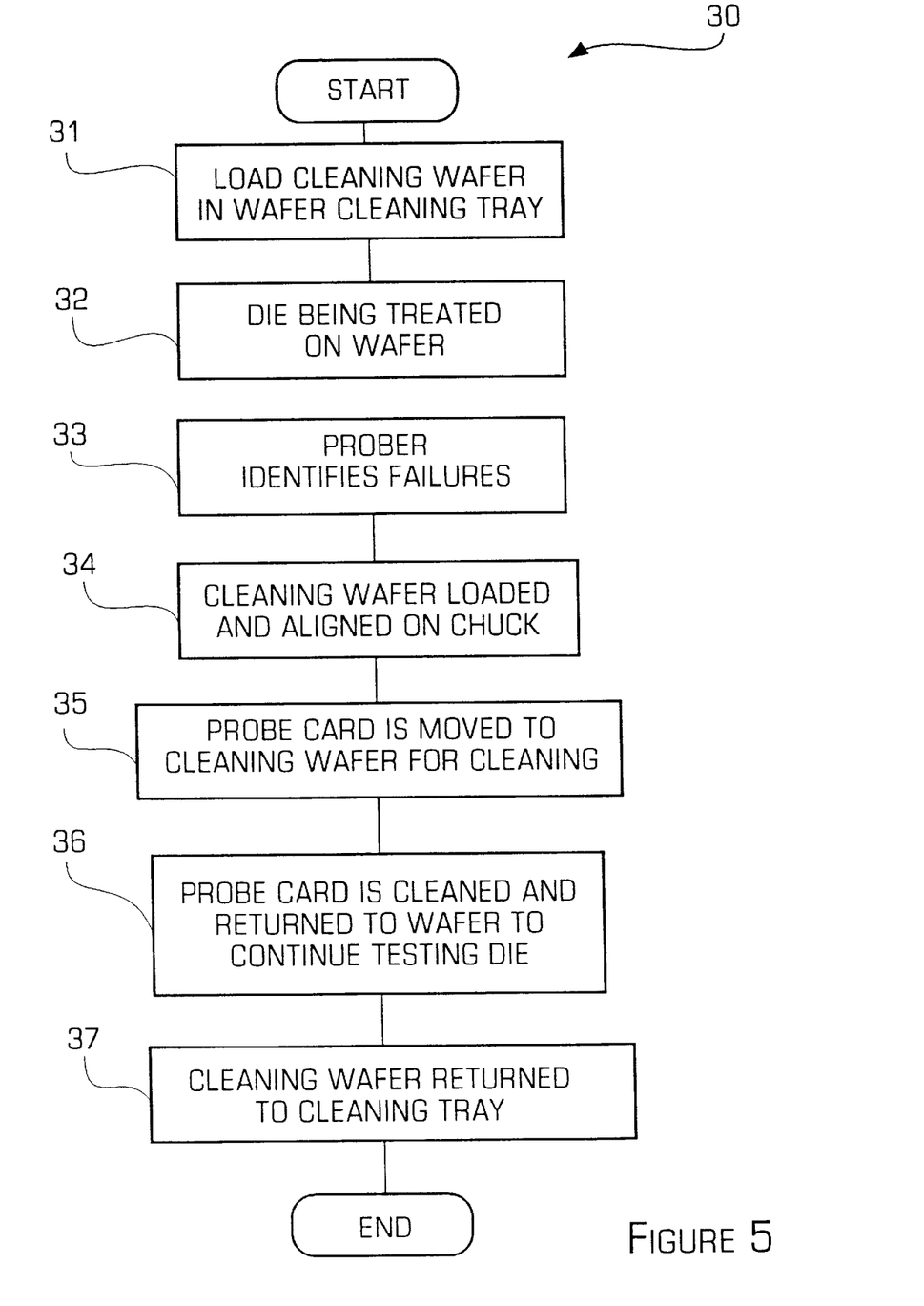
FIG. 5 is a flowchart illustrating a method for cleaning a probe tip in accordance with the invention.

FIG. 5 is a flowchart illustrating a method 30 for cleaning a plurality of probes in accordance with the invention. The method accomplishes the goal of removing the debris from the probe tips without removing the probe card from the prober, which increases the productivity of the tester. In step 31, the cleaning device, that may have the same size and shape as typical wafers containing the dies being tested by the tester, may be inserted into a wafer cleaning tray. In accordance with the invention, the cleaning medium may be located in the wafer cleaning tray or one or more cleaning pads may be inserted into one or more cassettes that also contain wafers with semiconductor devices to be tested so that, as each cassette is run through the tester, the cleaning device in the cassette cleans the probe elements. In step 32, the tester is operated and tests the semiconductor dies on the wafers. In step 33, the prober identifies a predetermined number of failures in the dies being tested which indicates that the prober element's may be dirty. In step 34, the cleaning device in accordance with the invention (a wafer) is loaded and aligned with the chuck. In step 35, the probe elements in the tester contact the cleaning device so that the debris is removed from the probe elements or the tips of the probes may be reshaped. As described above, this cleaning step may occur either when the cleaning device is periodically installed from the wafer cleaning tray into the prober or every time from the wafer cassette, or anytime the prober cleans the probe card on the burnishing plate. In step 36, the cleaning is completed and the prober returns to testing the die and wafers. In step 37, the cleaning wafer is returned to the cleaning tray so that the prober machine can continue to test dies. In accordance with the invention, the cleaning device does not interrupt, in any way, the operation of the prober since the cleaning of the probes is accomplished during the normal operation of the testing machine. In this manner, the cleaning device is inexpensive and permits the probe to be cleaned and/or shaped without removing the probe card from the prober. Now, another embodiment of the cleaning device in accordance with the invention will be described.

Figure 6A:
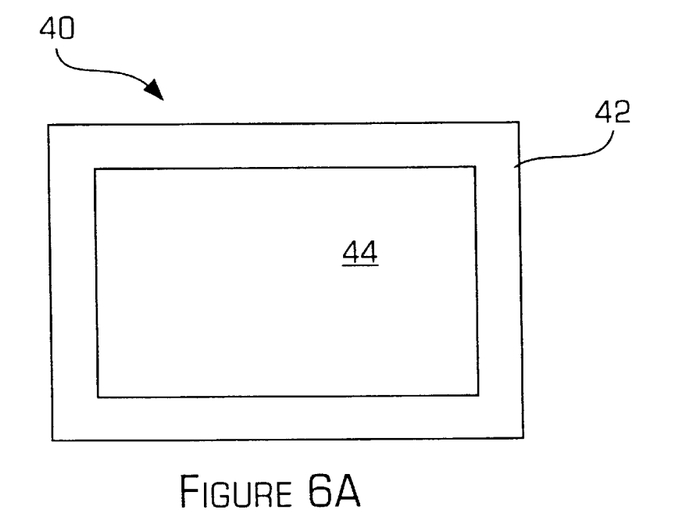
FIGS. 6A and 6B are diagrams illustrating another embodiment of the cleaning device in accordance with the invention.
Figure 6B:
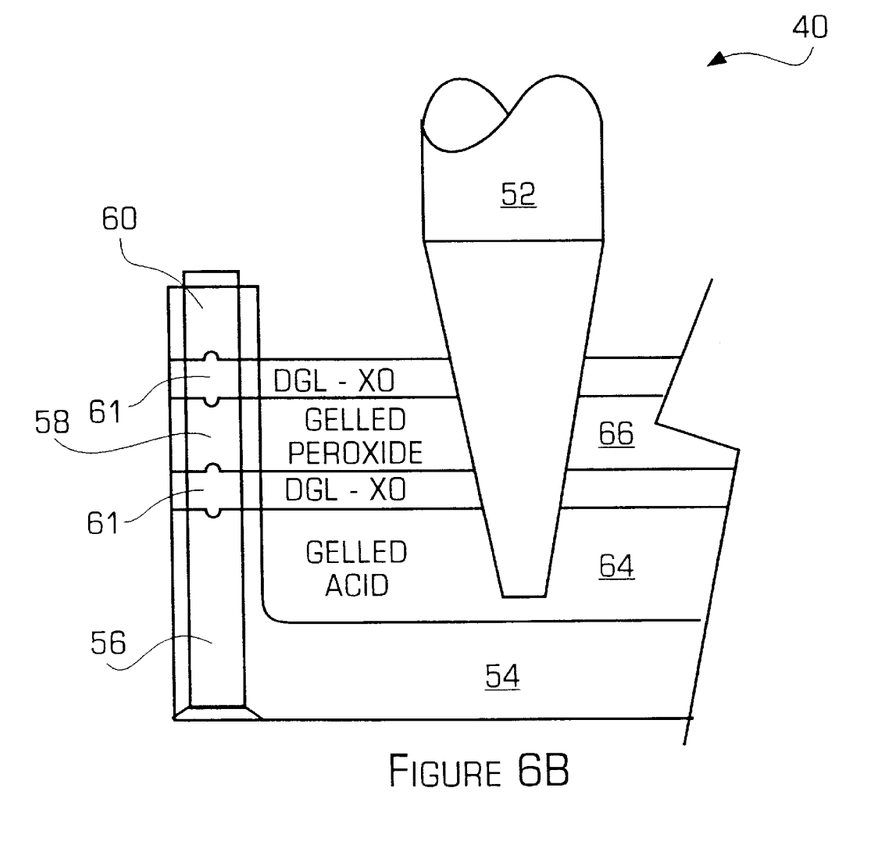

FIGS. 6A and 6B are diagram illustrating a second embodiment of a cleaning device 40 in accordance with the invention. In more detail, the cleaning device 40 may include one or more different layers of material which may clean or sharpen the probe elements as will now be described. Thus, in accordance with this embodiment of the invention, the cleaning pad may be placed on a substrate for use on the abrasive plate in the prober, the prober chuck, analyzer or any other machine. As shown in FIG. 6A, the cleaning device 40 may include a frame 42 that encloses one or more layers of chemical cells 44. The layers in the cleaning device may be made of a material which exhibits acetic or basic chemical properties which may be used to oxidize and/or reduce contaminates on the probe tips. The layers may also be made of materials that induce chemical reactions and/or mechanical actions that remove such contaminates. The removal of the contaminates, such as heavy metals, that may be environmentally hazardous will be trapped on or in the pad so that they will not be dispersed into the air. This embodiment will now be described in more detail with reference to FIG. 6B.

FIG. 6B is a diagram illustrating a second embodiment of a cleaning device 40 in accordance with the invention with a probe needle 52 inserted into the layers of the cleaning device in order to clean the probe needle. In more detail, the cleaning device may have a shape of a typical wafer so that it may be used in-line and may further include one or more different layers of material. In particular, the cleaning device 40 may include a substrate 54 having a wall wherein the wall may be constructed of several pieces made of chemically resistant material. The walls may include a bottom portion 56, a middle portion 58 and an upper portion 60 stacked on top of each other with a layer of elastomeric material 61 in between the portions of the wall. The walls of the substrate form a well region into which one or more different layers of chemicals may be placed and these chemicals may etch away materials struck onto the probe needles. A first bottom well 64 of the substrate may be filled with an acid matrix such as acetic acid, as described with reference to FIG. 7 and sealed into the well by a layer 61 of elastomeric material.

The chemical matrix may consist of chemicals in any form, solid, liquid, gas, or encapsulated, emulsified, saturated, gelled, or the like, provided the amount of chemical induces the desired reaction. Once the seal is in place, the middle portion of the wall 58 may be positioned and secured to the seal by an adhesive, mechanical, thermal, or like methods to form a second well 66. In the second well 66, a peroxide mixture that gels is placed into the well as described in more detail with reference to FIG. 7, and sealed by a sealing layer 61. Finally, the upper portion 60 is secured to the top seal layer to form the cleaning device in accordance with the invention.

During the cleaning operation, the probe needle 52 may penetrate through the two seal layers 61 and thus extend into the acid and peroxide matrix layers in the wells. The acid and peroxide may react with the contaminates on the probe needle to remove heavy metals and the like. In particular, the acid and peroxide matrix may remove the contaminates from the probe needle and the contaminants may be trapped in the cleaning device by the sealing layers 61. Now, a method for manufacturing the cleaning device shown in FIGS. 6A and 6B will be described.

Figure 7:
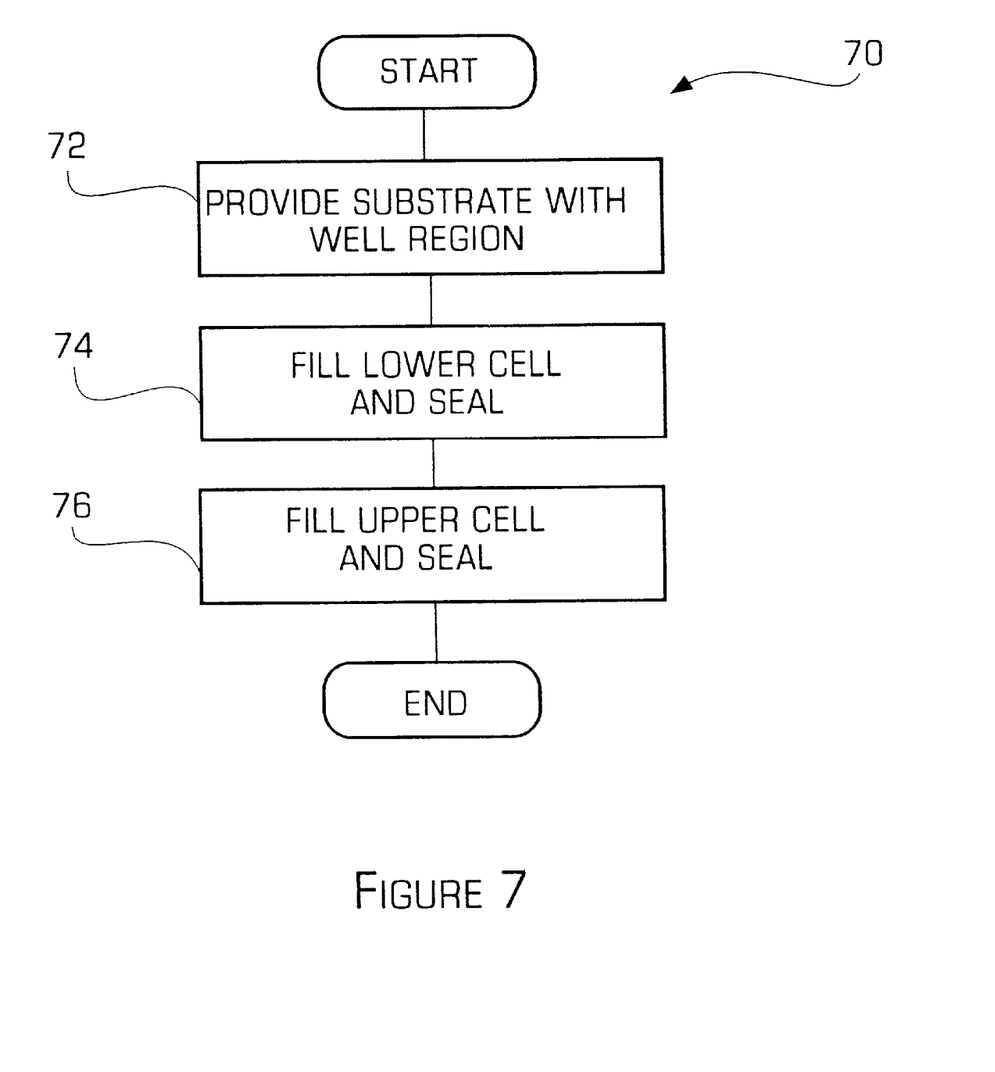
FIG. 7 is a flowchart illustrating a method for manufacturing the cleaning device shown in FIGS. 6A and 6B.

FIG. 7 is a flowchart illustrating a method 70 for manufacturing the cleaning device 40 shown in FIGS. 6A and 6B. In particular, in step 72, a substrate with a well region is provided. The substrate is typically made of a chemical resistant material such as certain types of plastic. In step 74, the lower cell of the substrate is filled with the appropriate chemicals and sealed using the elastomeric material. In step 76, the upper cell of the substrate is filled with the appropriate chemicals and sealed using the elastomeric material. Thus, a two layer cleaning device in accordance with the invention is formed. In accordance with the invention, however, the cleaning device may have any number of different layers of chemicals wherein each different layer may serve a particular function such as removing a different contaminant from the probe element. The above embodiment is typically used for a system that tests the wafers or one or more dies on a semiconductor wafer prior to being encapsulated into a package. Now, another embodiment of the cleaning device will be described wherein the cleaning device may be used for cleaning the probe elements of a handler or a tester that may be used to electrically test the leads of a packaged integrated circuit.

In accordance with another embodiment of the invention, the cleaning device described above may also be used in connection with an handling/testing apparatus that is used to handling and testing integrated circuits (IC) wherein an individual semiconductor die from the wafer described above has been encapsulated into a material, such as plastic. The IC package may have one or more electrical leads extending out from the package that communicate electrical signals, such as a power signal, a ground signal, etc., with the die inside of the package. The testing/handling apparatus may have a plurality of probe elements (similar to the probe card tester described above) that contact the leads of the package and test the electrical characteristics of the packaged IC in a typical manner. Similar to the probe card cleaner embodiment, the cleaning device may be, in a preferred embodiment, a semiconductor shaped substrate with a pad material wherein the probe elements of the handler/tester may contact the pad periodically to remove debris from the tips of the probe elements as described above. The various different materials used for the cleaning device including the multi-layer embodiment may be used with the tester/handler. The size of the cleaning device may be modified slightly to fit the size and shape of the particular tester/handler.

While the foregoing has been with reference to a particular embodiment of the invention, it will be appreciated by those skilled in the art that changes in this embodiment may be made without departing from the principles and spirit of the invention, the scope of which is defined by the appended claims.

What is claimed is:

1. A cleaning device for cleaning the probe elements in a semiconductor testing apparatus, the cleaning device comprising:

a substrate having a configuration to be introduced into the testing apparatus during the normal testing operating of the testing apparatus, wherein the substrate comprises a semiconductor wafer; and a pad, secured to the substrate, the pad having predetermined characteristics that cause the pad to clean debris from the probe elements when the probe elements contact the pad so that the probe elements are cleaned, without modification or damage, during the normal operation of the testing machine; wherein the pad comprises one or more layers of chemical cleaning agents, which may oxidize and/or reduce contaminates when the probe elements are inserted into the pad and wherein one or more layers comprise a first layer of gelled acid and a second layer of gelled oxidizing agent.

2. The cleaning device of claim 1, wherein the predetermined characteristics comprise one or more of durometer, tack and elasticity.

3. The cleaning device of claim 1, wherein the pad comprises a tacky material so that the debris adheres to the pad when the probe elements contact the pad.

4. The cleaning device of claim 1, wherein the gelled acid comprises acetic acid and the gelled oxidizing agent comprises peroxide.

5. The cleaning device of claim 1, wherein the pad traps hazardous material, such as lead, on and within the pad when the probe elements are inserted into the pad so that the hazardous materials are not released into the environment.

6. The cleaning device of claim 1, wherein the pad comprises an elastomeric material that traps and removes the debris from the probe elements within and on the surface of the pad.

7. The cleaning device of claim 6, wherein the elastomeric material comprises one or more of rubbers, synthetic polymers and natural polymers.

8. The cleaning device of claim 7, wherein the pad further comprises an abrasive material that maintains the shape of or shapes the tips of the probe elements when the probe elements are driven into and removed from the elastomeric network.

9. A cleaning device for cleaning the probe elements in a semiconductor testing apparatus, the cleaning device comprising:

a substrate having a configuration to be introduced into the testing apparatus during the normal testing operation of the testing apparatus; and a cleaning pad having one or more layers of chemicals that clean the probe elements and one or more sealing layers that confine the chemical layers and keeps debris removed from the probe elements in the cleaning pad so that the probe elements are cleaned during the normal operations of the testing machine, wherein the one or more layers comprise a first layer of gelled acid and a second layer of gelled oxidizing agent.

10. The cleaning device of claim 9, wherein the gelled acid comprises acetic acid and the gelled oxidizing agent comprises peroxide.

11. A method for cleaning the probe elements of a testing machine, the method comprising:
  loading a cleaning device into the prober, the cleaning device having the same configuration as the wafers with the semiconductor dies normally tested by the testing apparatus, the cleaning device having a top surface with predetermined properties that clean the probe elements; and
  contacting the probe elements with the cleaning device during the normal testing operation of the prober so that any debris is removed from the probe elements during the normal operation of the testing machine, the cleaning device having one or more layers of chemicals that clean the probe elements and one or more sealing layers that confine the chemical layers and keeps debris removed from the probe elements in the cleaning pad so that the probe elements are cleaned during the normal operations of the testing machine, wherein the one or more layers comprise a first layer of gelled acid and a second layer of gelled oxidizing agent.

12. The method of claim 11, wherein the loading further comprises periodically loading a cleaning cassette containing one or more cleaning devices into the testing machine when the probe elements are being cleaned.

13. The method of claim 11, wherein the loading further comprises loading one or more cleaning devices into one or more cassettes along with semiconductor wafers having dies being tested by the prober so that the cleaning devices are contacted during the testing process of the die.

14. The method of claim 13, wherein the probe card remains in a cleaned state for a longer period of time increases yield performance increases the amount of revenue for the manufacturer.

15. The method of claim 14, wherein the probe card cleaning device is able to prolong the life of the probe card reduced the number of probe cards the manufacturer is required to purchase in order to have spares.

16. The method of claim 15, wherein less abrasive cleaning is required to be done to the probe card the extended life of the probe card is two to three times longer reducing the amount of probe cards needed to be purchased, increasing savings to the manufacturer.

17. The method of claim 16, wherein the cleaning material properties, such as density and abrasiveness can be selected for any given probe element material or shape to remove embedded or bonded debris without significant damage to the probe element reducing the amount of probe cards needed to be purchased, increasing savings to the manufacturer.

18. A cleaning device for cleaning probe elements comprising:
  a substrate having a predetermined configuration appropriate for the particular probe elements, wherein the substrate comprises a semiconductor wafer; and
  a pad, secured to the substrate, the pad having predetermined characteristics that cause the pad to clean debris from the probe elements when the probe elements contact the pad so that the probe elements are cleaned, wherein the pad comprises one or more layers of chemical cleaning agents, which may oxidize and/or reduce contaminates when the probe elements are inserted into the pad and wherein one or more layers comprise a first layer of gelled acid and a second layer of gelled oxidizing agent.

19. The cleaning device of claim 18, wherein the predetermined characteristics comprise one or more of durometer, tack and elasticity.

20. The cleaning device of claim 18, wherein the pad comprises a tacky material so that the debris adheres to the pad when the probe elements contact the pad.

21. The cleaning device of claim 18, wherein the gelled acid comprises acetic acid and the gelled oxidizing agent comprises peroxide.

22. The cleaning device of claim 18, wherein the pad traps hazardous material, such as lead, on and within the pad when the probe elements are inserted into the pad so that the hazardous materials are not released into the environment.

23. The cleaning device of claim 18, wherein the pad comprises an elastomeric material that traps and removes the debris from the probe elements within and on the surface of the pad.

24. The cleaning device of claim 23, wherein the elastomeric material comprises one or more of rubbers, synthetic polymers and natural polymers.

25. The cleaning device of claim 24, wherein the pad further comprises an abrasive material that maintains the shape of or shapes the tips of the probe elements when the probe elements are driven into and removed from the elastomeric network.

26. A cleaning device for cleaning the probe elements in a semiconductor testing apparatus, the cleaning device comprising:
  a substrate having a configuration to be introduced into the testing apparatus during the normal testing operating of the testing apparatus, wherein the substrate comprises a semiconductor wafer having a surface; and
  a pad, secured to the substrate, the pad having predetermined characteristics that cause the pad to clean debris from the probe elements when the probe elements contact the pad so that the probe elements are cleaned, without modification or damage, during the normal operation of the testing machine, wherein the semiconductor wafer surface has microroughness which burnishes the probe elements.

27. A cleaning device for cleaning the probe elements in a semiconductor testing apparatus, the cleaning device comprising:
  a substrate having a configuration to be introduced into the testing apparatus during the normal testing operation of the testing apparatus, the substrate comprising a semiconductor wafer having a surface; and
  a cleaning pad having one or more layers of chemicals that clean the probe elements and one or more sealing layers that confine the chemical layers and keeps debris removed from the probe elements in the cleaning pad so that the probe elements are cleaned during the normal operations of the testing machine, wherein the semiconductor wafer surface has microroughness which burnishes the probe elements.

28. A cleaning device for cleaning probe elements comprising:
  a substrate having a predetermined configuration appropriate for the particular probe elements, wherein the substrate comprises a semiconductor wafer having a surface; and
  a pad, secured to the substrate, the pad having predetermined characteristics that cause the pad to clean debris from the probe elements when the probe elements contact the pad so that the probe elements are cleaned, wherein the semiconductor wafer surface has microroughness which burnishes the probe elements.

* * * * *